United States Patent
Aoki et al.

(10) Patent No.: US 8,410,615 B2
(45) Date of Patent: Apr. 2, 2013

(54) SEMICONDUCTOR DEVICE AND METHOD FOR MANUFACTURING THE SAME

(75) Inventors: Mayu Aoki, Kokubunji (JP); Kenichi Takeda, Higashimurayama (JP); Kazuyuki Hozawa, Hino (JP)

(73) Assignee: Hitachi, Ltd., Tokyo (JP)

(*) Notice: Subject to any disclaimer, the term of this patent is extended or adjusted under 35 U.S.C. 154(b) by 4 days.

(21) Appl. No.: 13/178,470

(22) Filed: Jul. 7, 2011

(65) Prior Publication Data

US 2012/0068355 A1 Mar. 22, 2012

(30) Foreign Application Priority Data

Sep. 21, 2010 (JP) .................. 2010-211078

(51) Int. Cl.
 *H01L 21/28* (2006.01)
(52) U.S. Cl. ...................................... 257/774
(58) Field of Classification Search ........... 257/E21.158, 257/E23.011, 773, 774, 737
 See application file for complete search history.

(56) References Cited

U.S. PATENT DOCUMENTS

| 6,531,022 | B1* | 3/2003 | Tsukahara | 156/256 |
| 6,815,818 | B2* | 11/2004 | Moore et al. | 257/751 |
| 7,145,231 | B2* | 12/2006 | Hasebe et al. | 257/712 |
| 7,893,407 | B2* | 2/2011 | Syms | 250/396 R |
| 2008/0185518 | A1* | 8/2008 | Syms | 250/296 |
| 2011/0266692 | A1* | 11/2011 | Sasaki et al. | 257/774 |
| 2011/0291210 | A1* | 12/2011 | Batchelder | 257/429 |

FOREIGN PATENT DOCUMENTS

| JP | 2003-188343 A | 7/2003 |
| JP | 2008-078419 A | 4/2008 |

* cited by examiner

*Primary Examiner* — Thao Le
(74) *Attorney, Agent, or Firm* — Miles & Stockbridge P.C.

(57) ABSTRACT

A semiconductor device including two silicon wafers stacked and bonded together with bumps of one wafer electrically coupled with those of the other wafer, in which generation of voids on the junction surface between the silicon wafers is suppressed. Due to a recess made in the surface of a buried conductive film, a cavity is formed in the junction surface between the silicon wafers. The ends of the cavity extend to the periphery of the junction surface between the silicon wafers. This allows the air trapped on the junction surface between the silicon wafers to get out through the cavity, thereby reducing the possibility of generation of voids on the junction surface.

20 Claims, 16 Drawing Sheets

SEMICONDUCTOR DEVICE AND METHOD FOR MANUFACTURING THE SAME

CLAIM OF PRIORITY

The present application claims priority from Japanese patent application JP 2010-211078 filed on Sep. 21, 2010, the content of which is hereby incorporated by reference into this application.

FIELD OF THE INVENTION

The present invention relates to a semiconductor device and a method for manufacturing the same and more particularly to technology for a semiconductor device including multiple semiconductor substrates electrically coupled through bumps and the manufacture thereof.

BACKGROUND OF THE INVENTION

In recent years, as an approach to reducing the size of a semiconductor device and enhancing its performance, packaging techniques that semiconductor substrates of single-crystal silicon (hereinafter called silicon substrates) are stacked and electrically coupled using microelectrode wires have been developed.

Among these packaging techniques, a technique which has been recently attracting attention is that the integrated circuits formed on plural silicon substrates are electrically coupled with each other using so-called bumps as microelectrodes for joining silicon substrates and so-called through silicon vias as electrodes penetrating silicon substrates.

In the case of a semiconductor device based on the above technique, the junction reliability of the bumps for joining silicon substrates would deteriorate due to stress such as heat or impact applied to the silicon substrates. For this reason, it is imperative to protect the bumps by sealing the areas around the bumps with insulator such as resin in order to assure the junction reliability of the bumps.

NCP (non-conductive paste)/NCF (non-conductive film) is used as a method for sealing the areas around the bumps with resin. In this method, prior to bonding two silicon substrates (for example, silicon wafers) with bumps formed thereon, thermosetting resin, typically epoxy resin, is coated on each silicon substrate and after that, the two silicon substrates are heated and pressure-bonded to couple the bumps electrically.

However, the above pre-coating method has the following problem: resin adhering to the junction surface between bumps may get into a gap between the bumps during the heating and pressure-bonding process. This may result in an increase in the contact resistance between the bumps or cause the bumps to fail to contact each other, leading to deterioration in the reliability in the junction of the bumps.

Therefore, in order to prevent the resin from getting to the junction surface between the bumps, several techniques have been proposed that the resin covering the bumps is partially removed to expose the junction surface and junction between bumps and bonding between resin films are performed simultaneously.

For example, Japanese Unexamined Patent Application Publication No. 2003-188343 discloses a technique that after a resin film whose thickness is larger than the height of bumps is coated on the main surface of an LSI chip with bumps formed thereon, the resin is polished until the top of each bump is exposed. This makes it possible to join two LSI chips (join the bumps and bond the resin films together) with no resin on the junction surface between bumps. Hereinafter the technique described in Japanese Unexamined Patent Application Publication No. 2003-188343 is called related example 1.

However, the related example 1 has a problem that since it is difficult to polish and flatten the resin junction surface, air may be trapped on the junction surface between the resin films and become a void.

With this background, Japanese Unexamined Patent Application Publication No. 2008-078419 proposes a technique that a channel is made in the resin around each bump and such channels are interconnected and the interconnected channels extend to the ends of the silicon substrates to allow the air trapped between the two silicon substrates to escape outside. Hereinafter the technique described in Japanese Unexamined Patent Application Publication No. 2008-078419 is called related example 2.

FIG. 22 is a plan view showing the essential part of the main surface of a silicon wafer 30A before the bonding step in the related example 2. In FIG. 22, scribe lines SL as indicated by dotted lines represent lines along which dicing is performed to divide the silicon wafer 30A into silicon chips. This structure is created as follows: after pillar bumps 31 are formed on the main surface of the silicon wafer 30A, resin 32 is coated on it and the resin 32 around the bumps 31 is removed by photolithography or etching. The channels made by removal of the resin 32 around the bumps 31 are communicated with each other and the ends of the channels 33 extend to the periphery of the silicon wafer 30A.

FIG. 23 is a sectional view schematically showing the structure after the bonding step in the related example 2. A bump 31 and a resin film 32 around it are formed on the main surface of a first silicon wafer 30A and a channel 33 is made between them. Similarly, a bump 31 and a resin film 32 surrounding it are formed on the main surface of a second silicon wafer 30B and a channel 33 is made between them. Therefore, when the main surface of the first silicon wafer 30A and the main surface of the second silicon wafer 30B are bonded together with both the surfaces facing each other, a cavity 34 for air ventilation is made around the bump 31.

SUMMARY OF THE INVENTION

The related example 2, in which the resin around the bumps is removed and channels are formed in advance, has the following problems in joining the bumps formed on two silicon wafers and bonding the resin films together.

First, since the bumps are surrounded by channels extending to the ends of the silicon wafers, a chemical solution gets into the channels in the process of cleaning the bonded silicon wafers. Consequently the bumps would corrode because they contact with the chemical solution, resulting in an increase in the contact resistance between bumps. In addition, the air trapped in the channels might cause oxidization of the bump surface, resulting in a further increase in the contact resistance between bumps.

Second, as mentioned above, after the formation of bumps on the main surface of a silicon wafer, resin is coated and the resin around the bumps is removed by photolithography or an etching technique to make channels. Since this process involves a number of steps, it is less productive.

The present invention is intended to solve the above problems inherent in the related techniques and has an object to bond silicon substrates with high reliability by preventing void generation between the substrates and forming bumps and sealing resin coatings productively.

The above and further objects and novel features of the invention will more fully appear from the following detailed description in this specification and the accompanying drawings.

Preferred embodiments of the invention which will be disclosed herein are briefly summarized below.

According to a first aspect of the present invention, there is provided a semiconductor device having a first substrate and a second substrate, in which an integrated circuit and a first electrode electrically coupled with the integrated circuit are formed on the main surface of the first substrate and a second electrode is formed on the main surface of the second substrate and the first electrode and the second electrode are electrically coupled by bonding of the main surface of the first substrate and the main surface of the second substrate. In the semiconductor device, a first insulating film is formed on the main surface of the first substrate, the first electrode is formed inside a first bump hole made in a first region of the first insulating film, a first conductive film of the same material as the first electrode is formed inside a first channel made in a second region of the first insulating film, a surface level of the first electrode is the same as a surface level of the first insulating film, a recess having a surface level lower than the surface level of the first insulating film is made in a surface of the first conductive film, and the ends of the first channel extend to the periphery of the first substrate.

According to a second aspect of the invention, there is provided a semiconductor device having a first substrate with a first electrode formed on one surface and a second substrate with a second electrode formed on one surface, in which the first electrode and the second electrode are electrically coupled by bonding of the one surface of the first substrate and the one surface of the second substrate. In the semiconductor device, a first insulating film is formed on the one surface of the first substrate, the first electrode is formed inside a first bump hole made in a first region of the first insulating film, a first channel having no electrode therein is disposed in a second region of the first insulating film, and a surface of a material disposed in said first channel is recessed with respect to a surface of the first insulating film.

The advantageous effects achieved by the preferred embodiments of the present invention as disclosed herein are briefly summarized below.

According to the first aspect of the invention, a cavity is made on the junction surface between the first and second substrates due to the recess in the surface of the first conductive film buried in the first channel. This allows the air trapped on the junction surface to get out through the cavity, thereby reducing the possibility of generation of voids.

According to the second aspect of the invention, when the semiconductor substrate and another substrate are bonded with one surface of the semiconductor substrate facing one surface of the other substrate, a cavity is made on the junction surface between the substrates due to the recess in the surface of the first conductive film buried in the first channel of the semiconductor substrate. This allows the air trapped on the junction surface to get out through the cavity, thereby reducing the possibility of generation of voids.

DETAILED DESCRIPTION OF THE PREFERRED EMBODIMENTS

Figure 1:
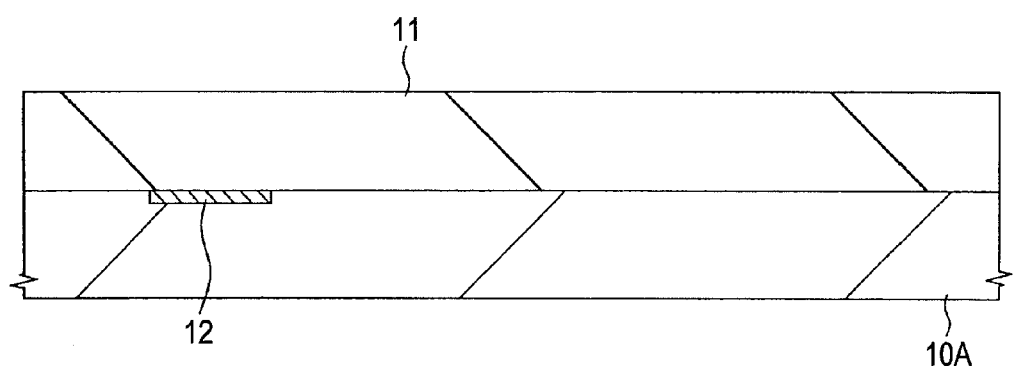
FIG. 1 is a sectional view schematically showing a step in the method for manufacturing a semiconductor device according to an embodiment of the invention.

Next, the preferred embodiments of the present invention will be described in detail referring to the accompanying drawings. In all the drawings that illustrate the preferred embodiments, elements with like functions are designated by like reference numerals and repeated descriptions of such elements are omitted. Descriptions of same or similar elements in the preferred embodiments are basically not repeated. In drawings that illustrate a preferred embodiment, hatching may be used even in a plan view for easy understanding or hatching may be omitted even in a sectional view.

The semiconductor device according to a first embodiment of the invention is a stack semiconductor device in which two silicon wafers with multiple bumps and a resin film surrounding them formed on their main surfaces are bonded together and the integrated circuits formed on the silicon wafers are electrically coupled through bumps.

Next, a method for manufacturing the semiconductor device according to the first embodiment will be described in the order of process sequence, referring to FIGS. 1 to 10.

First, as shown in FIG. 1, after a photosensitive resin film 11 is coated on the main surface of a first silicon wafer 10A using a spin coater, the photosensitive resin film 11 is prebaked. The photosensitive resin film 11 is, for example, made of an insulating material composed mainly of polybenzoxazole (PBO) precursor. The silicon wafer 10A is a pre-processed wafer with an integrated circuit formed in a specified region, in which the circuit includes semiconductor elements and interconnect wires for coupling them. In the illustration of FIG. 1, among the interconnect wires formed on the silicon wafer 10A, only an interconnect wire 12 is shown and the semiconductor elements and interlayer insulating film are omitted.

Figure 2:
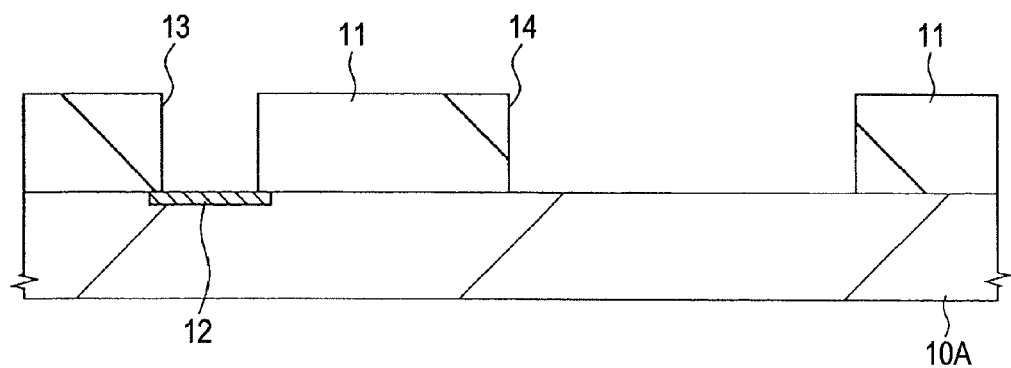
FIG. 2 is a sectional view schematically showing a manufacturing step subsequent to the step of FIG. 1.

Next, the photosensitive resin film 11 is exposed to light by an i-ray stepper or the like and then developed by an alkaline developer or the like. Through these steps, a bump hole 13 is made in the photosensitive resin film 11 above the interconnect wire 12 as shown in FIG. 2. A channel 14 is made a given distance away from the bump hole 13. The width of the channel 14 is larger than the diameter of the bump hole 13. For example, in this embodiment, the bump hole 13 has a diameter of 5 μm and the channel 14 has a width of 50 μm. After that, the photosensitive resin film 11 is completely hardened by post-baking. The thickness of the hardened photosensitive resin film 11 is, for example, 5 μm.

Figure 3:
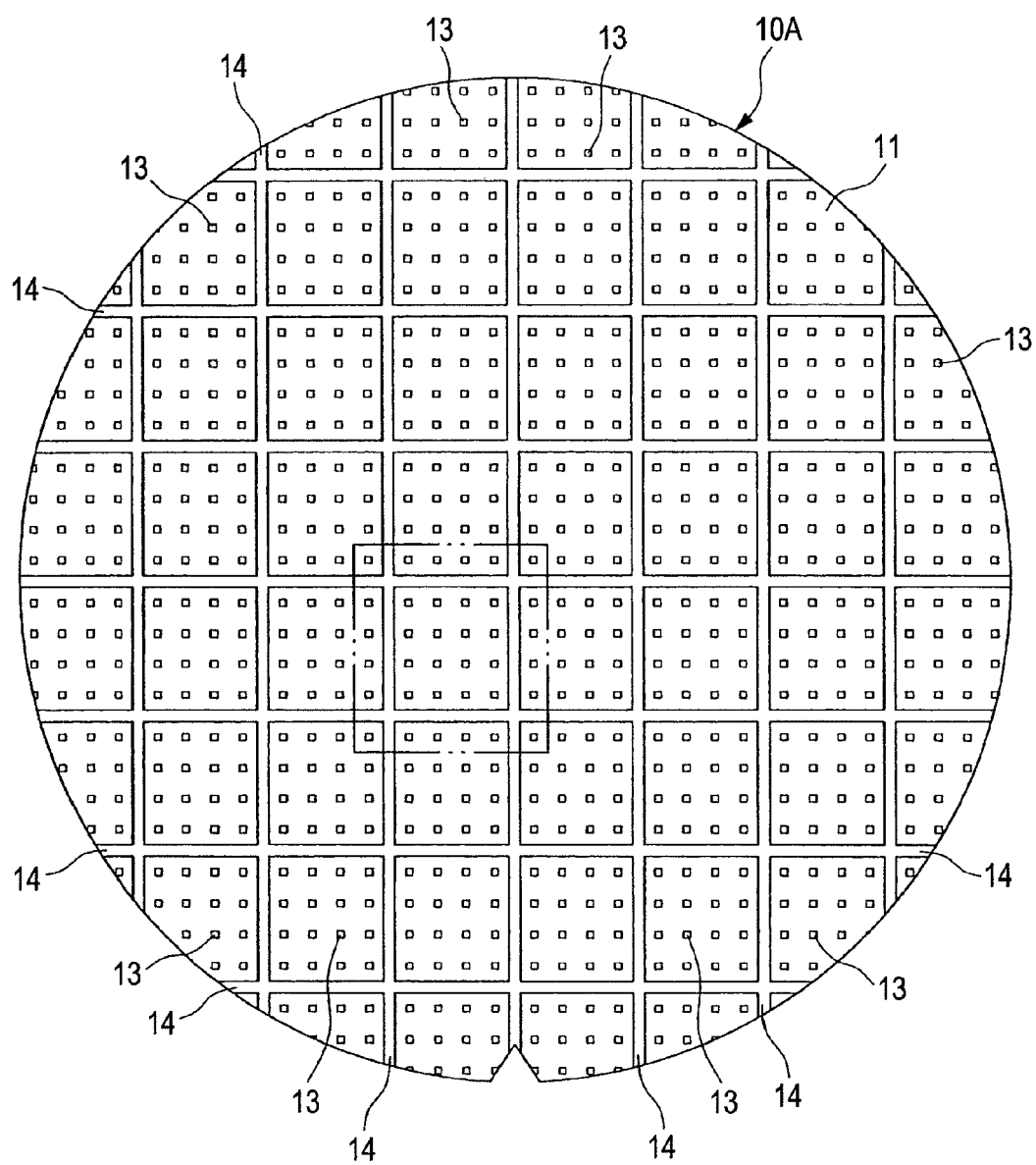
FIG. 3 is a plan view of a silicon wafer showing the arrangement of bump holes and channels made in a photosensitive resin film.
Figure 4:
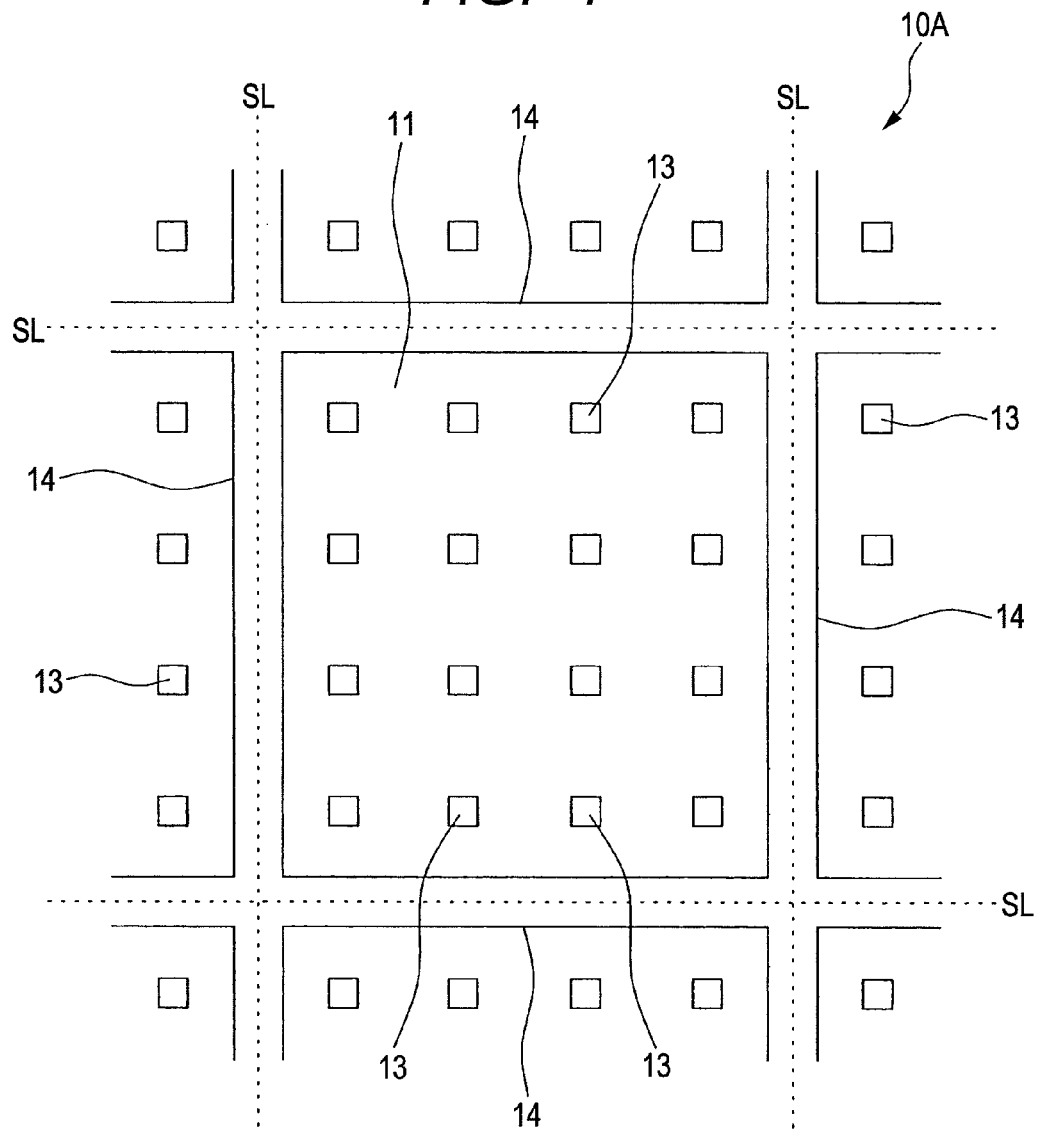
FIG. 4 is an enlarged plan view showing part of what is shown in FIG. 3.

FIG. 3 is a plan view of the silicon wafer 10A showing the arrangement of bump holes 13 and channels 14 made in the photosensitive resin film 11 and FIG. 4 is an enlarged plan view showing the area enclosed by two-dot chain line in FIG. 3.

As shown in FIGS. 3 and 4, the channels 14 are arranged along the scribe lines SL of the silicon wafer 10A to make a grid pattern. The channels 14 are interconnected with their ends extending to the periphery of the silicon wafer 10A. The bumps 13 are arranged in arrays in a rectangular region surrounded by channels 14.

Figure 5:
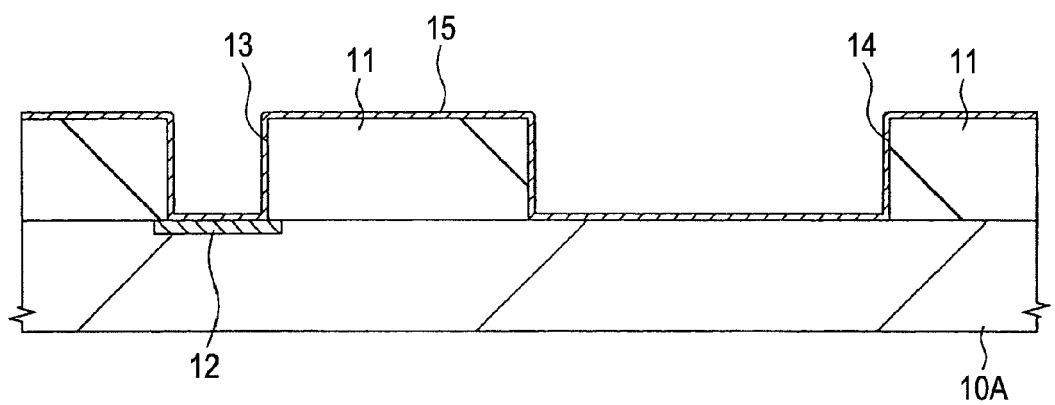
FIG. 5 is a sectional view schematically showing a manufacturing step subsequent to the step of FIG. 2.

Next, as shown in FIG. 5, a barrier metal film 15 of TiN (titanium nitride) with a thickness of 70 nm is deposited on the upper surface of the photosensitive resin film 11 and inside each of the bump holes 13 and channels 14 by sputtering. The barrier metal film 15 is formed in order to prevent the Cu film to be buried in the bump holes 13 and channels 14 later from diffusing into the photosensitive resin film 11.

Figure 6:
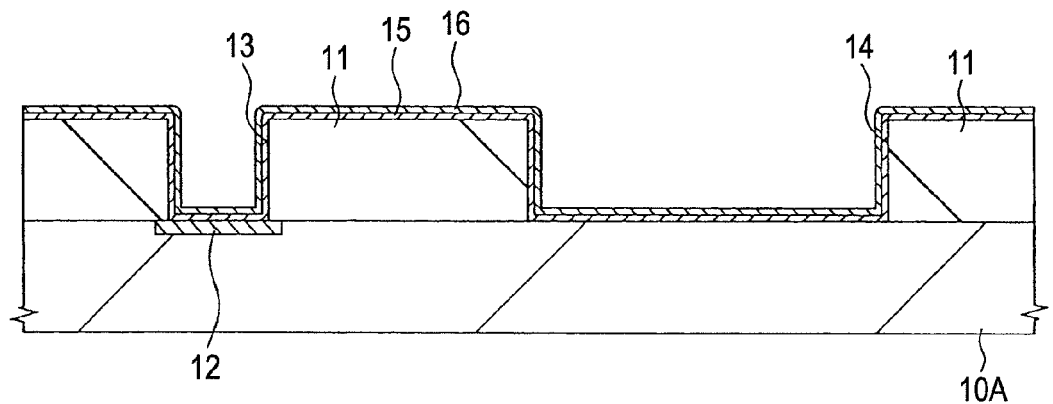
FIG. 6 is a sectional view schematically showing a manufacturing step subsequent to the step of FIG. 5.
Figure 7:
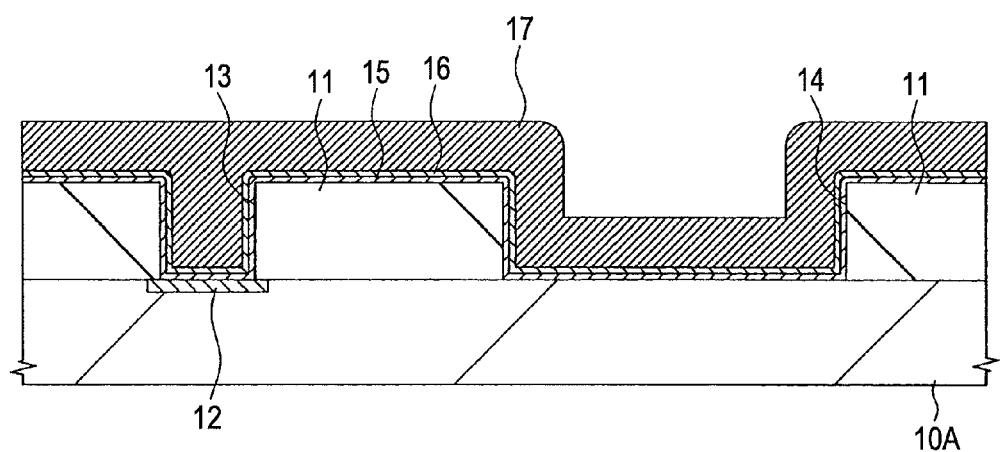
FIG. 7 is a sectional view schematically showing a manufacturing step subsequent to the step of FIG. 6.

Then, as shown in FIG. 6, a Cu seed film 16 with a thickness of about 100 nm is deposited over the barrier metal film 15 by sputtering and as shown in FIG. 7, a Cu film 17 is deposited over the Cu seed film 16 by electrolytic plating. The thickness of the Cu film 17 should be such that the inside of each bump hole 13 is completely filled and the inside of each channel 14 is not completely filled. In this embodiment, the thickness of the Cu film 17 is about 3 μm.

Figure 8:
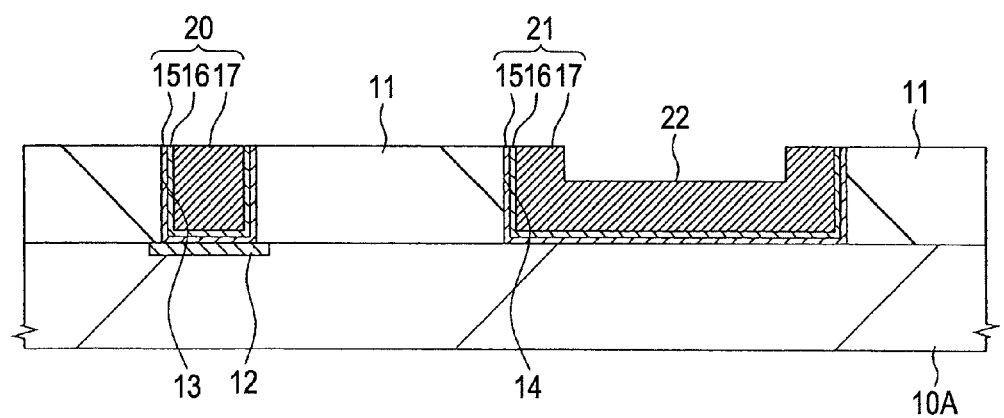
FIG. 8 is a sectional view schematically showing a manufacturing step subsequent to the step of FIG. 7.

Then, as shown in FIG. 8, the CU film 17, Cu seed film 16 and barrier metal film 15 over the photosensitive resin film 11 are polished in the order of mention by the chemical mechanical polishing (CMP) technique to expose the upper surface of the photosensitive resin film 11. Cu slurry is used for polishing the CU film 17 and Cu seed film 16 and barrier slurry is used for polishing the barrier metal film 15. Polishing is continued until there is no level difference between the upper surface of the Cu film 17 buried in the bump hole 13 and the upper surface of the photosensitive resin film 11, so that a flat junction plane is created.

By taking the above steps, a bump 20 composed of the Cu film 17, Cu seed film 16, and barrier metal film 15, is formed inside the bump hole 13. Also, a buried conductive film 21 composed of the CU film 17, Cu seed film 16 and barrier metal film 15 is formed inside the channel 14.

As mentioned above, the thickness of the CU film 17 inside the channel 14 is such that the inside of the channel 14 is not completely filled. This means that a recess 22 whose level is lower than the surface of the photosensitive resin film 11 is made in the surface of the buried conductive film 21 formed inside the channel 14.

Also, as mentioned above, the channels made in the photosensitive resin film 11 are interconnected with their ends extending to the periphery of the silicon wafer 10A. Therefore, the recess made in the surface of the buried conductive film 21 are also interconnected and their ends extend to the periphery of the silicon wafer 10A.

Figure 9:
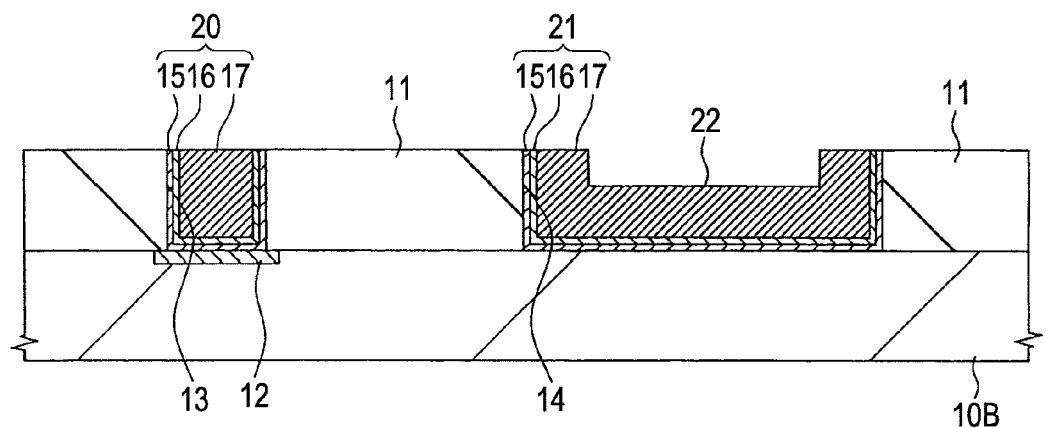
FIG. 9 is a sectional view schematically showing a manufacturing step subsequent to the step of FIG. 8.

Next, as shown in FIG. 9, a second silicon wafer 10B with an integrated circuit in a specified region is prepared and the same steps as shown in FIGS. 1 to 8 are carried out on the silicon wafer 10B. Specifically, after a bump hole 13 and a channel 14 are made in the photosensitive resin film 11 over the second silicon wafer 10B, a bump 20 is formed in the bump hole 13. A buried conductive film 21 with a recess 22 is formed in the channel 14.

Figure 10:
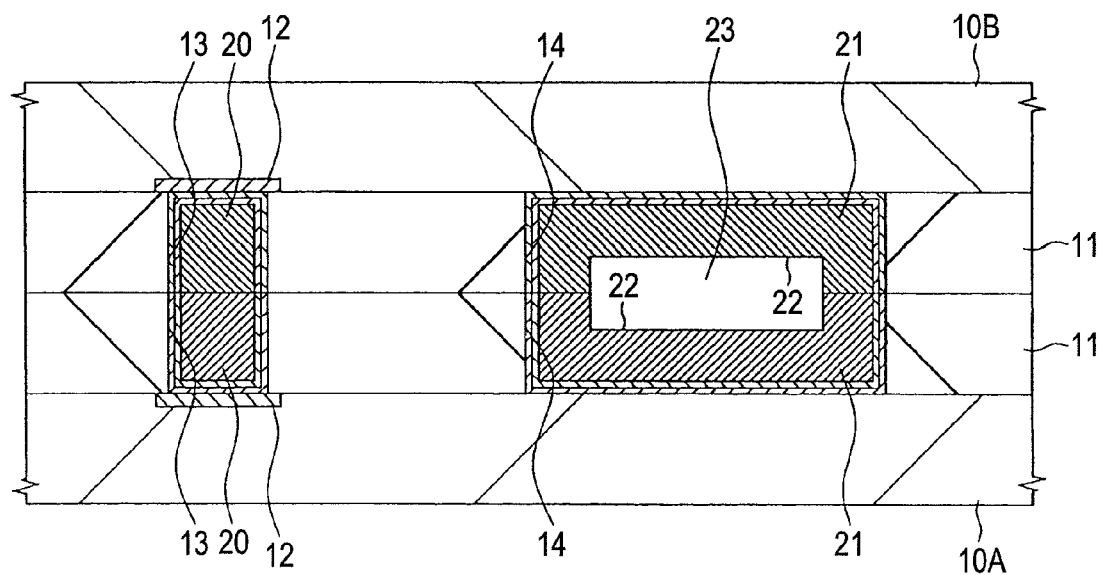
FIG. 10 is a sectional view schematically showing a manufacturing step subsequent to the step of FIG. 9.

Next, as shown in FIG. 10, the two silicon wafers 10A and 10B are laid one upon the other and heated and pressure-bonded. Then the bumps 20 of the two silicon wafers 10A and 10B are electrically coupled and at the same time their photosensitive resin films 11 are bonded together to complete the semiconductor device according to the first embodiment.

In the semiconductor device thus manufactured, a cavity 23 resulting from the recess 22 in the surfaces of the buried conductive films 21 is formed. As mentioned above, the recess in the surfaces of the buried conductive films 21 are interconnected with their ends extending to the peripheries of the silicon wafers 10A and 10B. Therefore, the cavities 23 formed in the junction surface between the silicon wafers 10A and 10B are also interconnected with their ends extending to the peripheries of the silicon wafers 10A and 10B.

Figure 11:
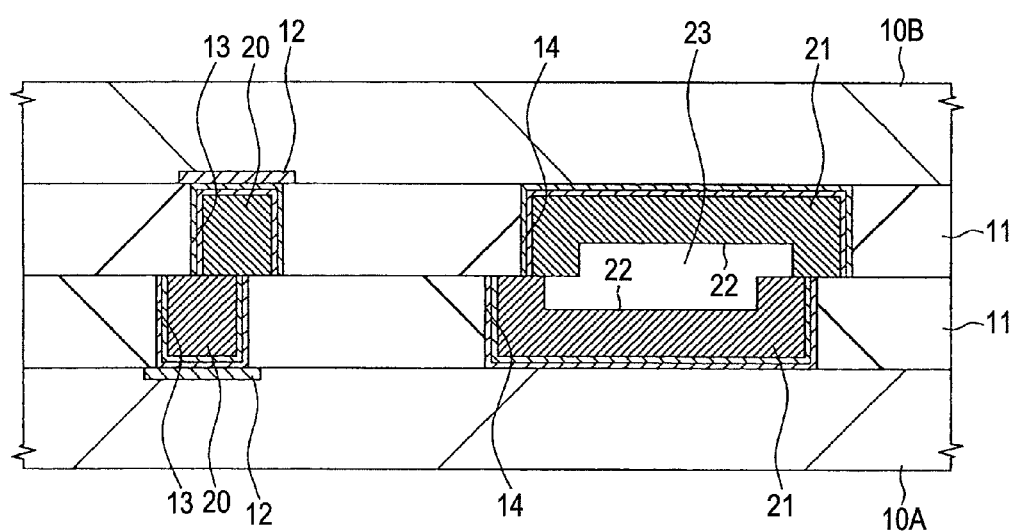
FIG. 11 is a sectional view schematically showing another example of a semiconductor device according to the present invention.

FIG. 10 shows a case that there is no misalignment between the silicon wafers 10A and 10B. However, since the width of the buried conductive film 21 is larger than the diameter of the bump 20, if misalignment is restricted to such an extent that the bump 20 of the silicon wafer 10A and the bump 20 of the silicon wafer 10B contact each other, a cavity 23 can be formed in the junction surface as shown in FIG. 11.

As for the semiconductor device according to the first embodiment and a semiconductor device (comparative example 1) which is the same in terms of manufacturing process and layout as in the first embodiment but has no channels 14 in the photosensitive resin film 11, using an ultrasonic flaw detector, a comparative evaluation was made concerning voids in the junction surface between the two silicon wafers 10A and 10B.

Figure 12A:
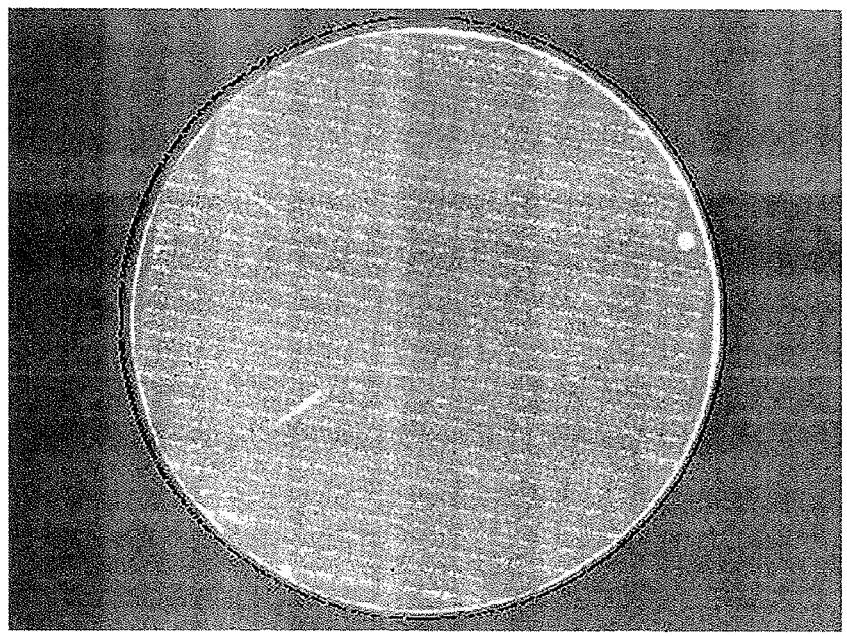
FIG. 12A is an ultrasonic photo of the semiconductor device according to the present invention and FIG. 12B is an ultrasonic photo of the related example 1.
Figure 12B:
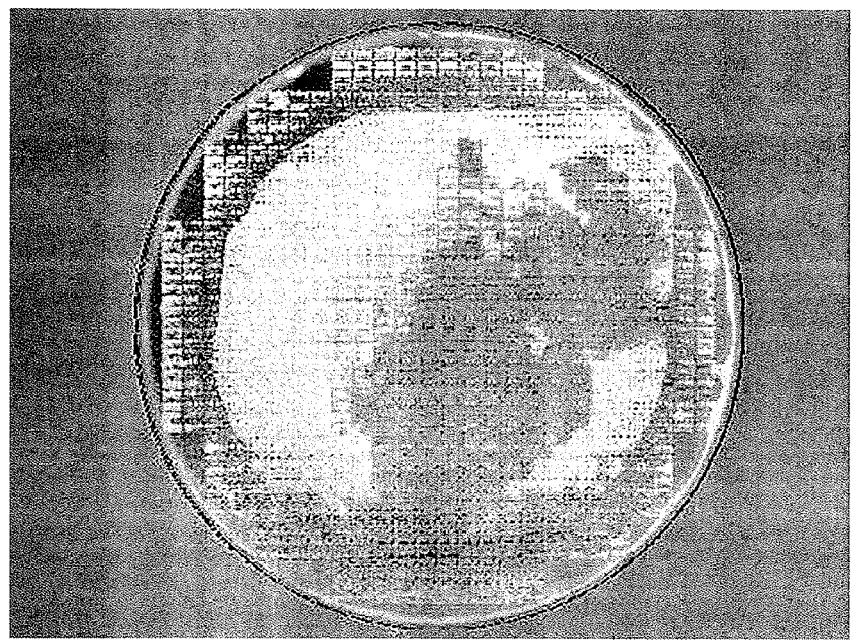

FIG. 12A is a scanning-acoustic tomography (SAT) image of the semiconductor device according to the first embodiment in which silicon wafers 10A and 10B with a diameter of 200 mm are bonded together. FIG. 12B is an ultrasonic photo of the semiconductor device as the comparative example 1 in which silicon wafers 10A and 10B with a diameter of 200 mm are bonded together. In FIGS. 12A and 12B, white spotty areas represent areas where voids are generated.

According to the evaluation of voids, voids were generated in 48% of the junction surface area in the comparative example 1 in which there are no cavities in the junction surface between the silicon wafers 10A and 10B. On the other hand, voids were generated only in less than 23% of the junction surface area in the first embodiment in which there are cavities 23 in the junction surface.

It has been found that when cavities 23 are formed in the junction surface between the silicon wafers 10A and 10B, the air trapped on the junction surface gets out through the cavities 23, thereby reducing the possibility of generation of voids.

Figure 22:
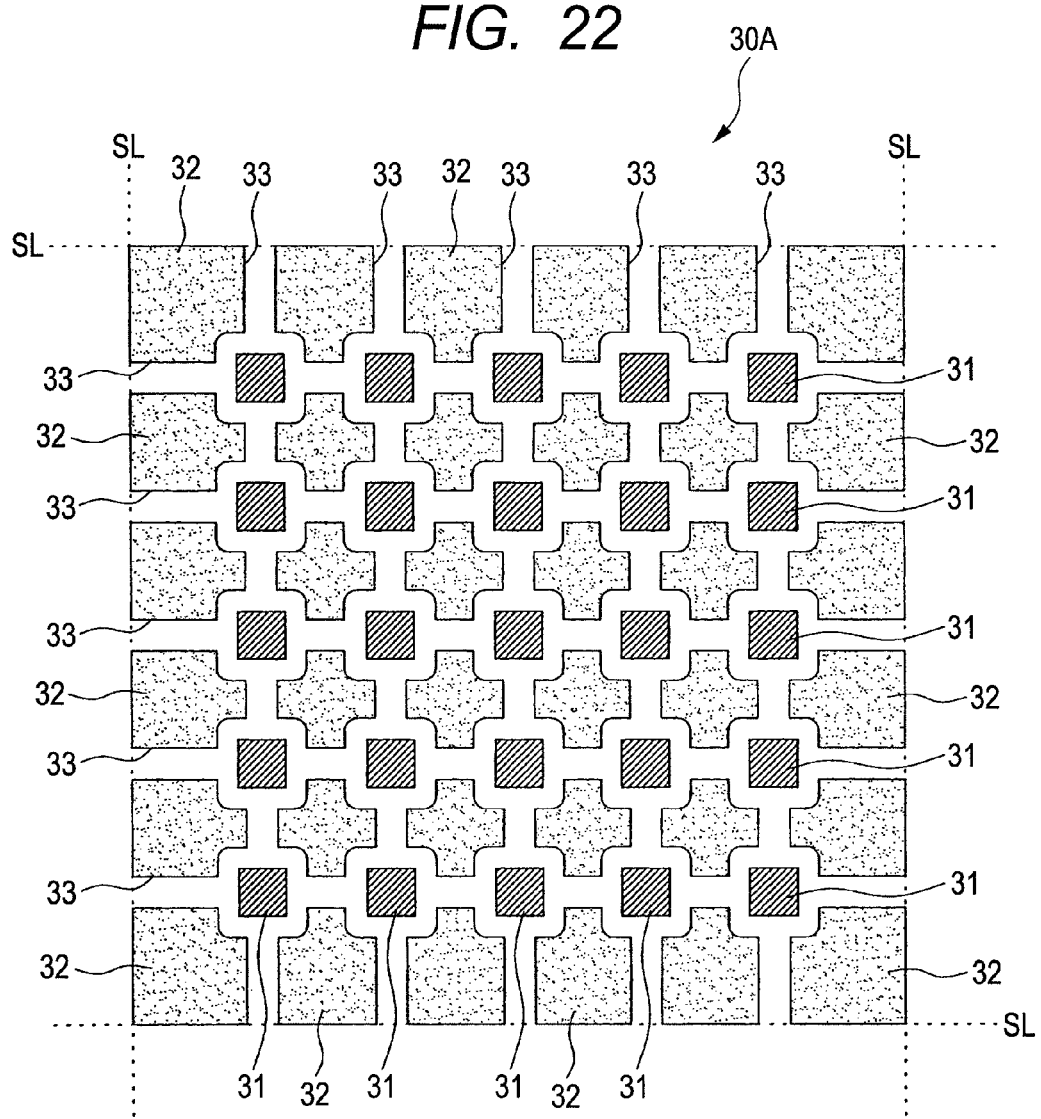
FIG. 22 is a plan view showing the essential part of the main surface of a silicon wafer before a bonding step in a related technique.
Figure 23:
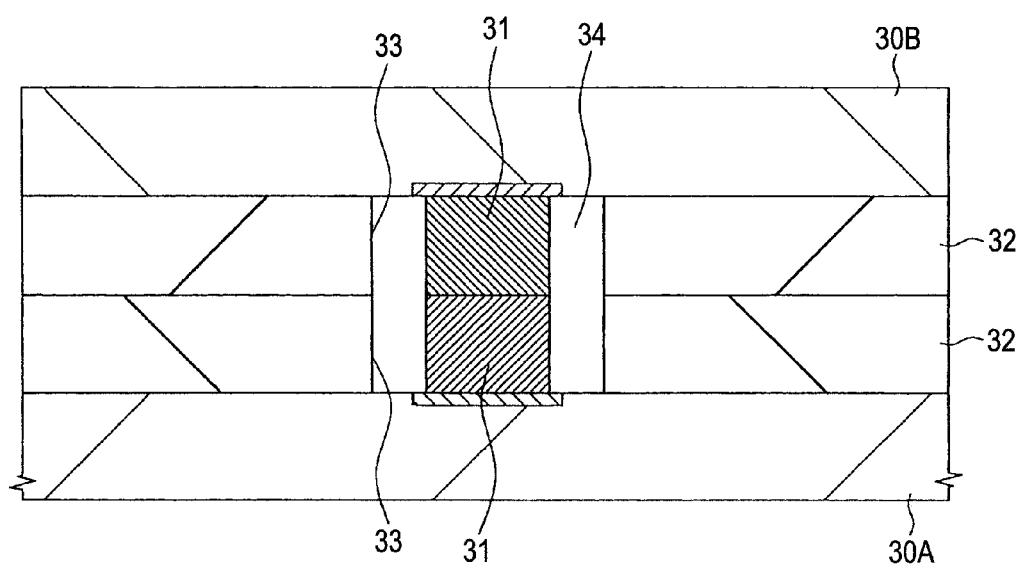
FIG. 23 is a sectional view showing the essential part after the bonding step in the related technique.

Next, as for the semiconductor device according to the first embodiment and the related example 2 having an air ventilation cavity 34 around each bump 31 (see FIGS. 22 and 23), their electrical characteristics were evaluated. As a result, it has been found that the semiconductor device according to the first embodiment is about 15% lower than the related example 2 in terms of the contact resistance between bumps 20.

The reason is that while in the related example 2 with a cavity 34 around each bump 31, the surface of the bump 31 may be oxidized or corroded due to the outside air or chemical trapped in the cavity 34, such corrosion or oxidization are not likely to occur in the first embodiment because the bump 20 is surrounded by the photosensitive resin film 11 and thus separated from the cavity 23.

As explained above, according to the first embodiment, reliability is enhanced in the semiconductor device in which the two silicon wafers 10A and 10B are laid one upon the other and bonded together and the bumps 20 formed on the silicon wafers 10A and 20A are electrically coupled.

In the related example 2, after the bumps 31 are formed on the main surface of the silicon wafer 30A, resin 32 is coated and the resin 32 around the bumps 31 is removed to make a cavity 34 for air ventilation. On the other hand, in the first embodiment, a photosensitive resin film 11 is coated on the main surface of the silicon wafer 10A, then when a bump 20 is formed inside each bump hole 13 made in the photosensitive resin film 11, a recess 22 is made at the same time, thereby offering an advantage that the number of steps is smaller than in the related example 2.

The invention made by the present inventors has been so far explained in reference to the first embodiment thereof. However, the invention is not limited thereto and it is obvious that these details may be modified in various ways without departing from the spirit and scope of the invention.

The first embodiment concerns a stack semiconductor device in which two silicon wafers 10A and 10B are bonded together. It is also possible that after the silicon wafers 10A and 10B are bonded together, they are diced along scribe lines SL (see FIG. 4) at a time to produce a stack semiconductor device with two silicon chips bonded together.

In the first embodiment, channels 14 are arranged along the scribe lines SL of the silicon wafers 10A and 10B. The number of channels 14 and their arrangement may be modified as appropriate. The planar arrangement pattern of the channels 14 is not limited to a grid but it may be curved or polygonal rather than quadrangular. The width of the channels 14 may be modified as appropriate. When the channels 14 are arranged along the scribe lines SL of the silicon wafers 10A and 10B, this is advantageous in that the arrangement of the bumps 20 is not restricted by the channels 14.

Figure 13:
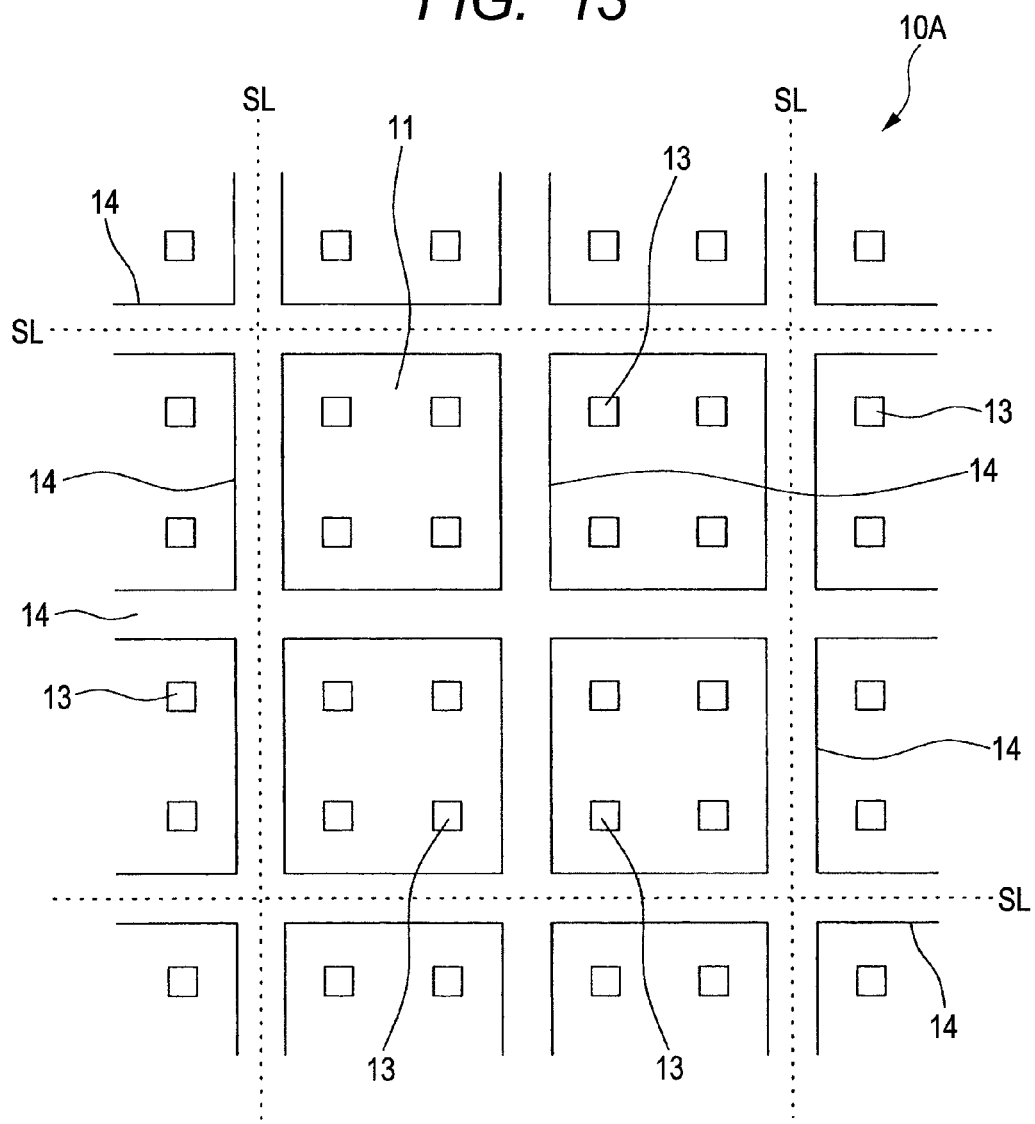
FIG. 13 is an enlarged plan view showing a further example of a semiconductor device according to the present invention.
Figure 14:
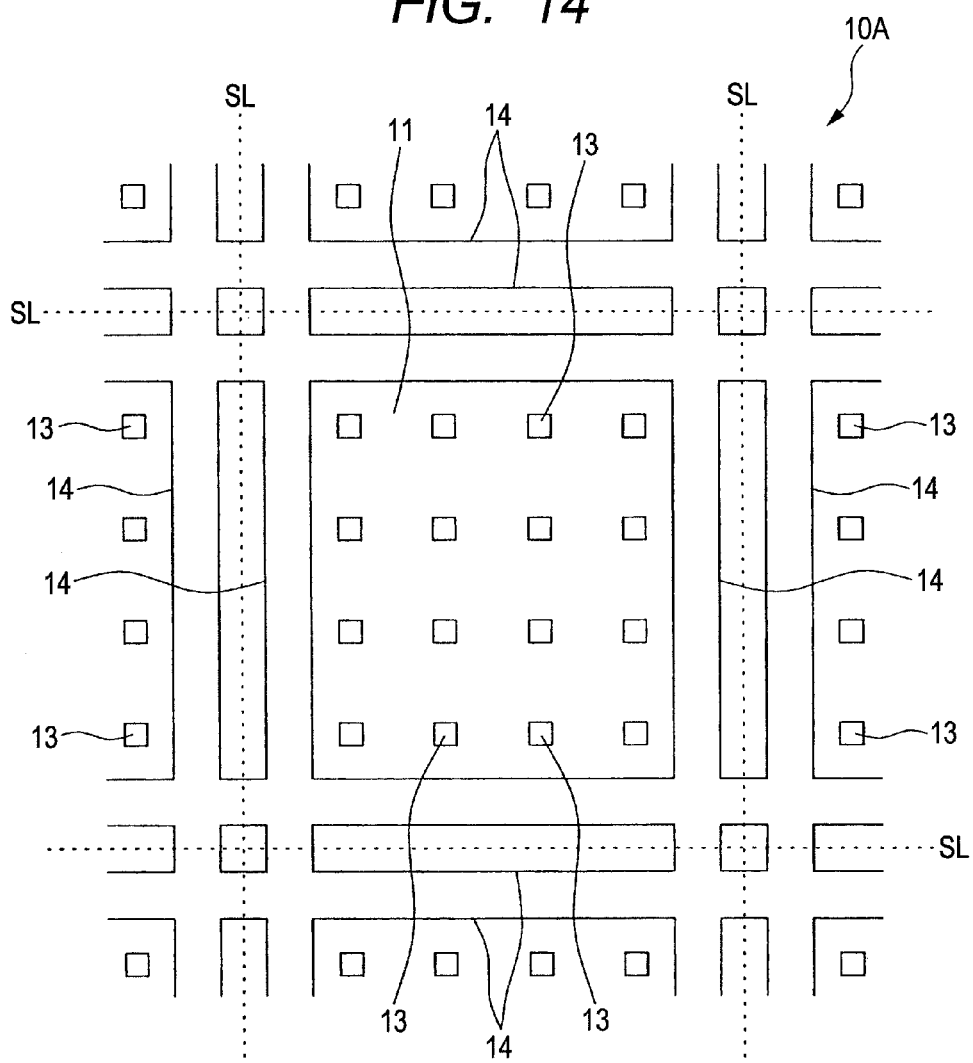
FIG. 14 is an enlarged plan view showing a further example of a semiconductor device according to the present invention.

FIG. 13 shows an example that channels 14 are disposed not only along the scribe lines SL but also in other regions and FIG. 14 shows an example that channels 14 are disposed on both sides of each scribe line SL.

In the example shown in FIG. 13, more channels 14 are provided than in the first embodiment, so the air trapped on the junction surface between the two silicon wafers 10A and 10B can be forced out more reliably. In the example shown in FIG. 14, when the silicon wafers 10A and 10B are diced into silicon chips, the bumps 20 are surrounded by the buried conductive films 21 in the channels 14. Therefore, water penetration into the silicon chips from outside can be prevented with higher reliability.

Figure 15:
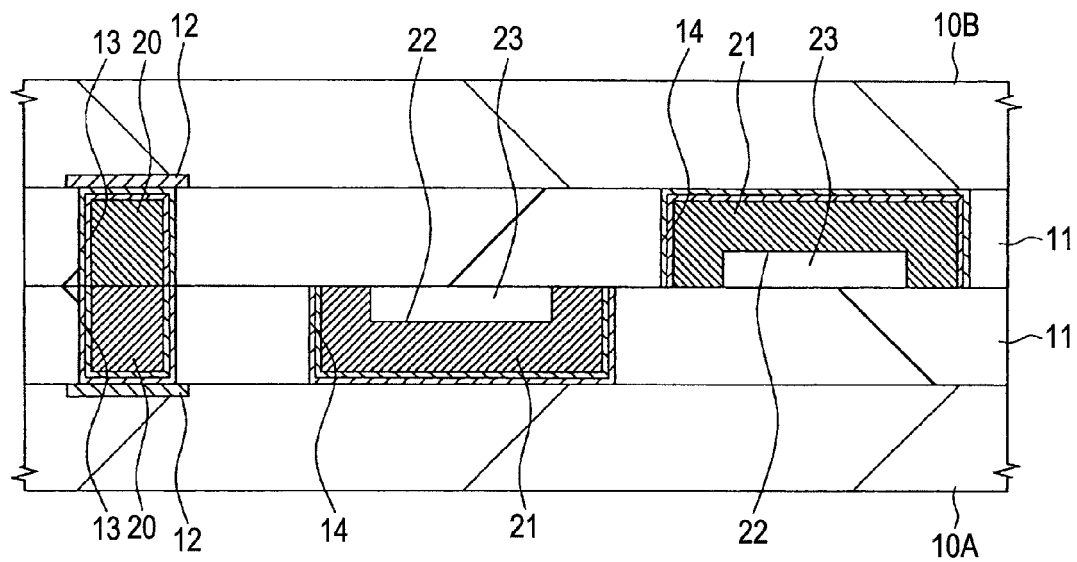
FIG. 15 is a sectional view showing the essential part of a further example of a semiconductor device according to the present invention.
Figure 16:
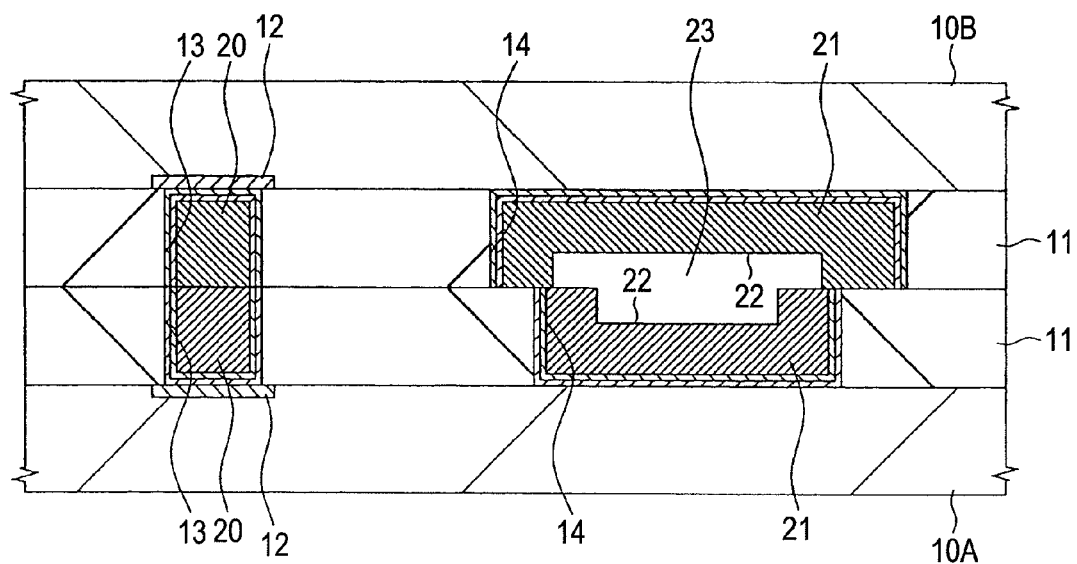
FIG. 16 is a sectional view showing the essential part of a further example of a semiconductor device according to the present invention.

While in the first embodiment, the arrangement of channels 14 in the silicon wafer 10A is the same as that in the silicon wafer 10B, it is also possible that as shown in FIGS. 15 and 16, the positions and width of channels 14 are different between the silicon wafers 10A and 10B. However, the width of every channel 14 made in the silicon wafers 10A and 10B should be larger than the diameter of bump holes 13.

Figure 17:
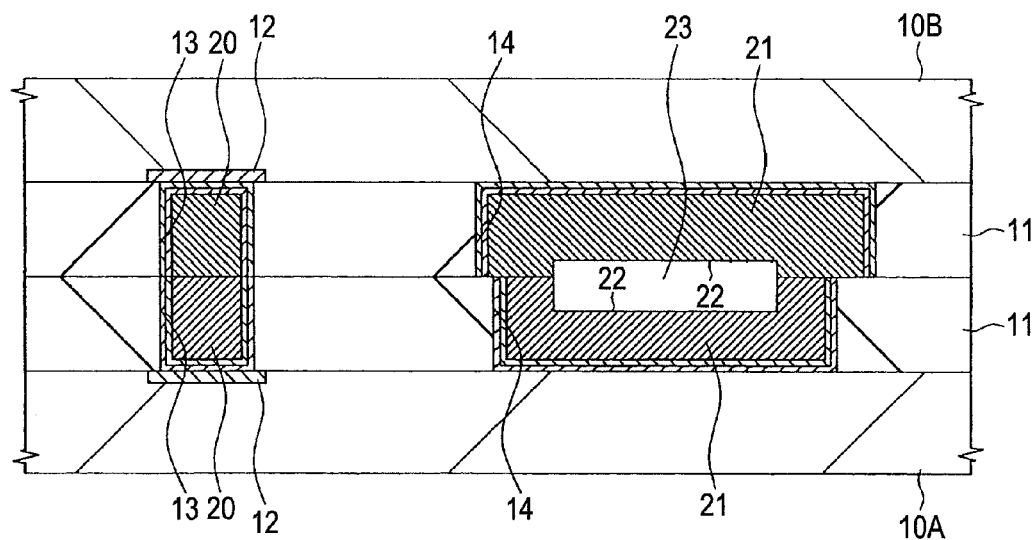
FIG. 17 is a sectional view showing the essential part of a further example of a semiconductor device according to the present invention.
Figure 18:
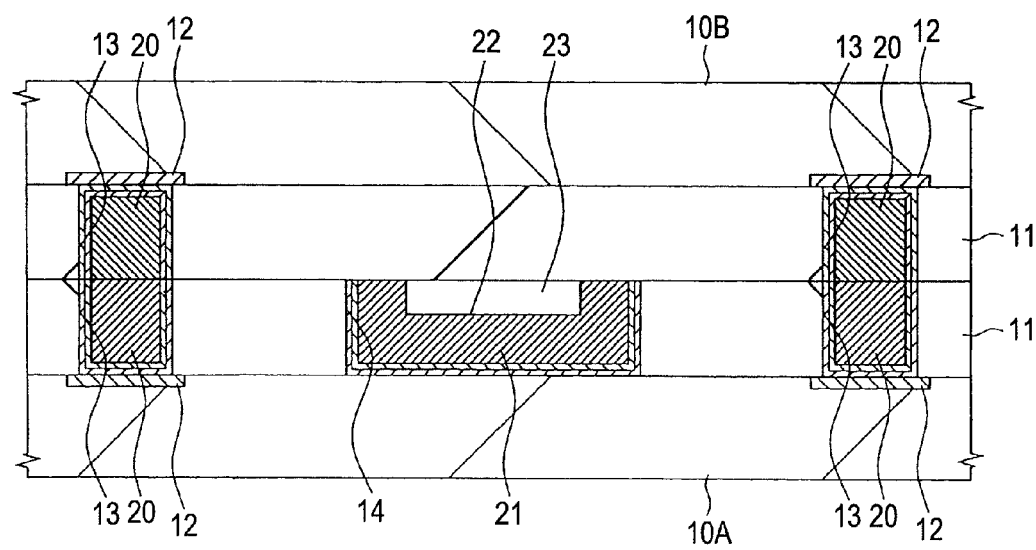
FIG. 18 is a sectional view showing the essential part of a further example of a semiconductor device according to the present invention.

As shown in FIG. 17, the depth of a recess 22 in the buried conductive film 21 formed in a channel 14 may be different between the silicon wafers 10A and 10B. In addition, as shown in FIG. 18, it is also possible that channels 14 are made only in one of the silicon wafers 10A and 10B and no channels are made in the other silicon wafer.

Figure 19:
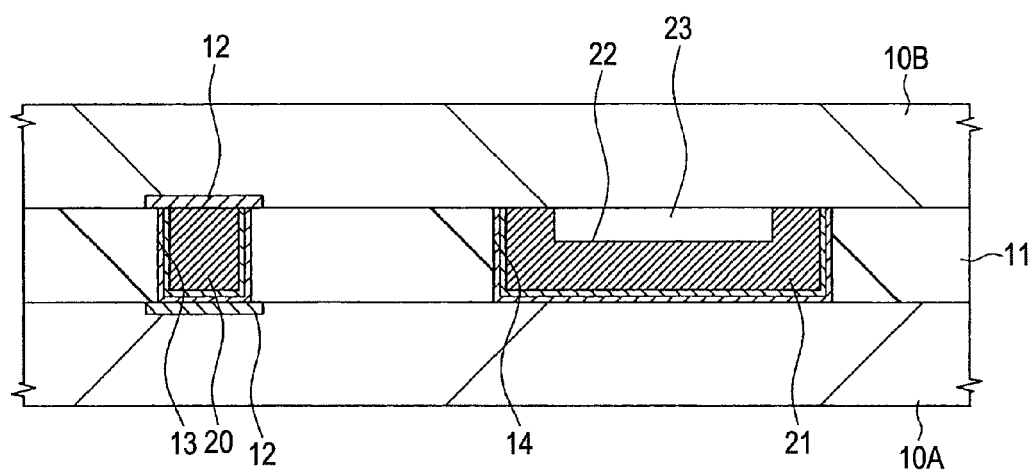
FIG. 19 is a sectional view showing the essential part of a further example of a semiconductor device according to the present invention.

While the photosensitive resin film 11, bump 20, and buried conductive film 21 are formed on the main surface of each of the silicon wafers 10A and 10B in the first embodiment, it is also possible that as shown in FIG. 19, the photosensitive resin film 11, bump 20, and buried conductive film 21 are not formed on the main surface of the silicon wafer 10B and the bump 20 of the silicon wafer 10A is directly coupled with the interconnect wire 12 of the silicon wafer 10B. Furthermore, as shown in FIG. 20, it is also possible to prepare a silicon wafer 10C with a through electrode 24 formed therein and directly couple the bump 20 of the silicon wafer 10A and the through electrode 24 of the silicon wafer 10C.

Figure 20:
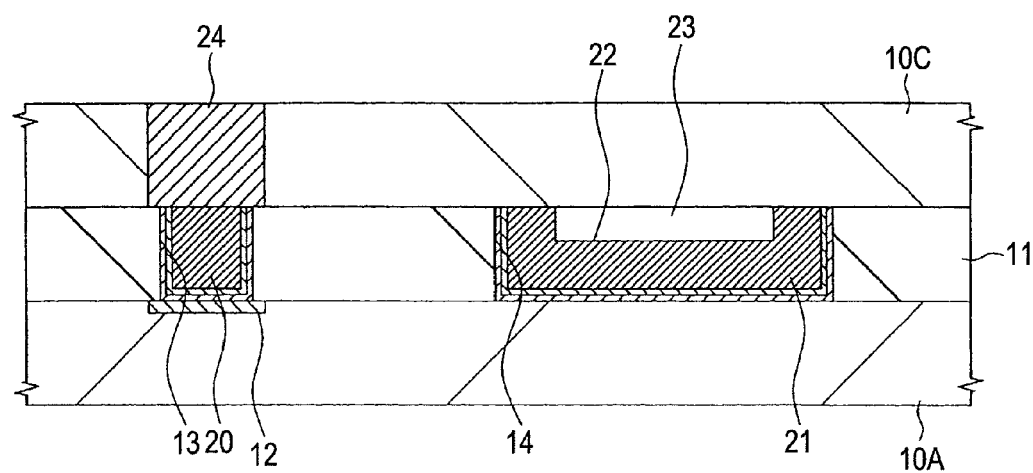
FIG. 20 is a sectional view showing the essential part of a further example of a semiconductor device according to the present invention.

In the examples shown in FIGS. 19 and 20, since the photosensitive resin film 11, bump 20, and buried conductive film 21 are formed on only one silicon wafer 10A, the number of steps in the semiconductor device manufacturing process can be considerably reduced.

In the example shown in FIG. 19, a wiring substrate may be used in place of the silicon wafer 10B and in the example shown in FIG. 20, a wiring substrate may be used in place of the silicon wafer 10C.

Figure 21:
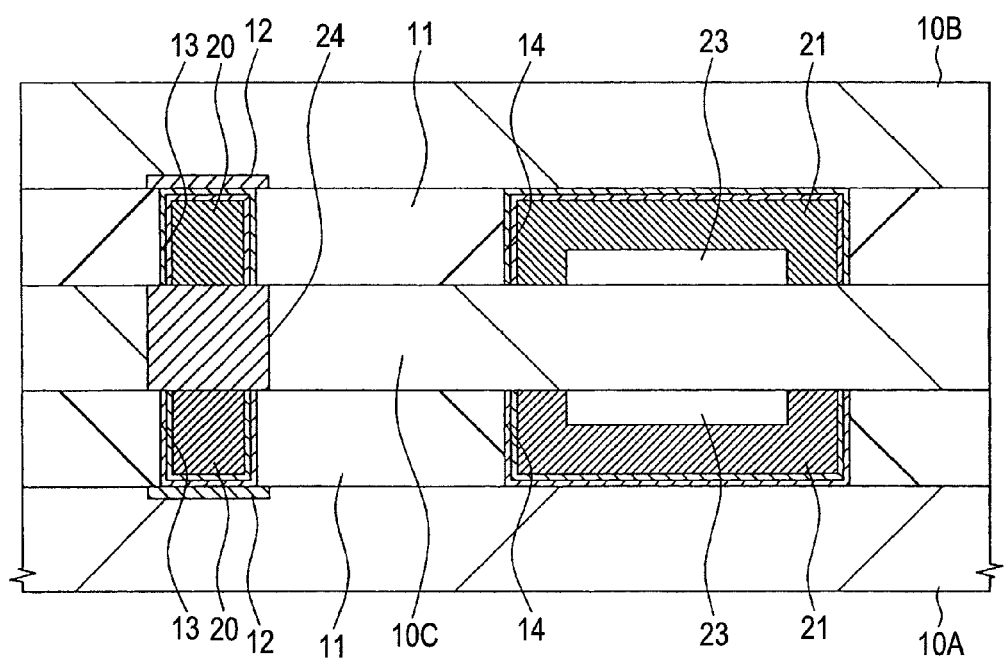
FIG. 21 is a sectional view showing the essential part of a further example of a semiconductor device according to the present invention.

In the first embodiment, the two silicon wafers 10A and 10B are bonded to make up a semiconductor device but the invention may be applied to a semiconductor device in which three or more silicon wafers are bonded. FIG. 21 shows an example that the silicon wafer 10A is bonded to one surface of the silicon wafer 10C with the through electrode 24 formed therein and the silicon wafer 10B is bonded to the other surface. In this case as well, a wiring substrate may be used in place of the silicon wafer 10C.

In the first embodiment, the bump holes 13 and channels 14 are made in the photosensitive resin film 11 coated on the main surface of the silicon wafer 10A; however, another insulating film, such as a non-photosensitive resin film or silicon oxide film may be used in place of the photosensitive resin film 11.

The present invention may be applied to semiconductor devices in which multiple semiconductor substrates are electrically coupled through bumps.

What is claimed is:

1. A semiconductor device having a first substrate with a first electrode formed on one surface and a second substrate with a second electrode formed on one surface, the first electrode and the second electrode being electrically coupled by bonding of the one surface of the first substrate and the one surface of the second substrate, wherein a first insulating film is formed on the one surface of the first substrate;

wherein the first electrode is formed inside a first bump hole, made in a first region of the first insulating film;

wherein a first conductive film of the same material as the first electrode is formed inside a first channel made in a second region of the first insulating film;

wherein a surface level of the first electrode is the same as a surface level of the first insulating film;

wherein a recess having a surface level lower than the surface level of the first insulating film is made in a surface of the first conductive film; and wherein ends of the first channel extend to a periphery of the first substrate.

2. The semiconductor device according to claim 1, wherein the first substrate is a semiconductor wafer or semiconductor chip.

3. The semiconductor device according to claim 2, wherein the first channels are made along scribe lines of the semiconductor wafer in a grid pattern.

4. The semiconductor device according to claim 1, wherein a width of the first channel is larger than a diameter of the first bump hole.

5. The semiconductor device according to claim 1, wherein the first insulating film is made of photosensitive resin.

6. The semiconductor device according to claim 1, wherein a second insulating film is formed on the one surface of the second substrate;

wherein the second electrode is formed inside a second bump hole made in a first, region of the second insulating film;

wherein a second conductive film of the same material as the second electrode is formed inside a second channel made in a second region of the second insulating film;

wherein a surface level of the second electrode is the same as a surface level of the second insulating film;

wherein a recess having a surface level lower than the surface level of the second insulating film is made in a surface of the second conductive film; and wherein ends of the second channel extend to a periphery of the second substrate.

7. The semiconductor device according to claim 1, wherein the one surface of the first substrate and the one surface of the second substrate are bonded to each other.

8. The semiconductor device according to claim 1, wherein the one surface of the first substrate and the one surface of the second substrate are bonded through an intermediate layer.

9. The semiconductor device according to claim 1, wherein the second electrode of the second substrate is a through electrode penetrating from the one surface of the second substrate to the other surface.

10. The semiconductor device according to claim 1, wherein the second substrate is a wiring substrate.

11. A method for manufacturing a semiconductor device having a first substrate with a first electrode formed on one surface and a second substrate with a second electrode formed on one surface, the first electrode and the second electrode being electrically coupled by bonding of the one surface of the first substrate and the one surface of the second substrate, in forming the first electrode on the one surface of the first substrate, comprising the steps of:

(a) forming a first insulating film on the one surface of the first substrate;

(b) making a first bump hole in a first region of the first insulating film and making a first channel in a second region of the first insulating film with ends extending to a periphery of the first substrate;

(c) forming, on an upper surface of the first insulating film and inside the first bump hole and the first channel, a first conductive film having such a thickness to fill an inside of the first bump hole and not completely fill an inside of the first channel; and (d) polishing the first conductive film using a chemical mechanical polishing technique until there is no level difference between an upper surface of the first conductive film buried in the first bump hole and an upper surface of the first insulating film, thereby forming, inside the first bump hole, the first electrode including the first conductive film, wherein at the step (d), a recess having a surface level lower than the surface level of the first insulating film is made in a surface of the first conductive film buried in the first channel.

12. The method for manufacturing a semiconductor device according to claim 11, wherein the first substrate is a semiconductor wafer or semiconductor chip.

13. The method for manufacturing a semiconductor device according to claim 12, wherein the first channels are formed along scribe lines of the semiconductor wafer in a grid pattern.

14. The method for manufacturing a semiconductor device according to claim 11, wherein a width of the first channel is larger than a diameter of the first bump hole.

15. The method for manufacturing a semiconductor device according to claim 11, wherein the first insulating film is made of photosensitive resin.

16. The method for manufacturing a semiconductor device according to claim 11, in forming the second electrode on the one surface of the second substrate, comprising the steps of:

(a) forming a second insulating film on the one surface of the second substrate;

(b) making a second bump hole in a first region of the second insulating film and making a second channel in a second region of the second insulating film with ends extending to a periphery of the second substrate;

(c) forming, on an upper surface of the second insulating film and inside the second bump hole and the second channel, a second conductive film having such a thickness to fill an inside of the second bump hole and not completely fill an inside of the second channel; and (d) polishing the second conductive film using a chemical mechanical polishing technique until there is no level difference between an upper surface of the second conductive film buried in the second bump hole and an upper surface of the second insulating film, thereby forming, inside the second bump hole, the second electrode including the second conductive film, wherein at the step (d), a recess having a surface level lower than the surface level of the second insulating film is made in a surface of the second conductive film buried in the second channel.

17. The method for manufacturing a semiconductor device according to claim 11, wherein the one surface of the first substrate and the one surface of the second substrate are bonded to each other.

18. The method for manufacturing a semiconductor device according to claim 11, wherein the one surface of the first substrate and the one surface of the second substrate are bonded through an intermediate layer.

19. A semiconductor device having a first substrate with a first electrode formed on one surface and a second substrate with a second electrode formed on one surface, the first electrode and the second electrode being electrically coupled by bonding of the one surface of the first substrate and the one surface of the second substrate,
  wherein a first insulating film is formed on the one surface of the first substrate;
  wherein the first electrode is formed inside a first bump hole made in a first region of the first insulating film;
  wherein a first channel having no electrode therein is disposed in a second region of the first insulating film, and a surface of a material disposed in said first channel is recessed with respect to a surface of the first insulating film.

20. The semiconductor device according to claim 19, wherein a width of the first channel is larger than a diameter of the first bump hole.

* * * * *